(12) United States Patent
Nakagawa et al.

(10) Patent No.: US 6,617,641 B2
(45) Date of Patent: Sep. 9, 2003

(54) HIGH VOLTAGE SEMICONDUCTOR DEVICE CAPABLE OF INCREASING A SWITCHING SPEED

(75) Inventors: Akio Nakagawa, Fujisawa (JP); Tomoko Matsudai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/059,186

(22) Filed: Jan. 31, 2002

(65) Prior Publication Data

US 2002/0100934 A1 Aug. 1, 2002

(30) Foreign Application Priority Data

Jan. 31, 2001 (JP) ........................ 2001-023369
Dec. 26, 2001 (JP) ........................ 2001-395241

(51) Int. Cl.$^7$ ................. H01L 29/76; H01L 29/74; H01L 31/111; H01L 31/062; H01L 31/113
(52) U.S. Cl. ................. 257/330; 257/139; 257/148; 257/341; 257/342; 257/339
(58) Field of Search ................. 257/341, 342, 257/339, 330, 331, 329, 139, 148

(56) References Cited

U.S. PATENT DOCUMENTS 5,237,183 A * 8/1993 Fay et al. .................... 257/139
5,352,910 A * 10/1994 Muraoka et al. ............ 257/148

FOREIGN PATENT DOCUMENTS

| JP | 4-269874 | * 9/1992 | ................. 257/342 |
| JP | 6-334186 | 12/1994 | ................. 257/341 |
| JP | 2000-516402 | 12/2000 | ................. 257/341 |

* cited by examiner

Primary Examiner—Steven Loke
(74) Attorney, Agent, or Firm—Oblon, Spivak, McClelland, Maier & Neustadt, P.C.

(57) ABSTRACT

An IGBT has a punch-through structure including an $n^+$ buffer layer. It includes a $p^-$ low concentration layer formed between the $n^+$ buffer layer and a $p^+$ drain layer. Owing to the low concentration layer, the drain current decreases to zero gradually, not rapidly, when the IGBT is turned off.

32 Claims, 10 Drawing Sheets

HIGH VOLTAGE SEMICONDUCTOR DEVICE CAPABLE OF INCREASING A SWITCHING SPEED

CROSS-REFERENCE TO RELATED APPLICATIONS

This application is based upon and claims the benefit of priority from the prior Japanese Patent Applications No. 2001-023369, filed Jan. 31, 2001; and No. 2001-395241, filed Dec. 26, 2001, the entire contents of both of which are incorporated herein by reference.

BACKGROUND OF THE INVENTION

1. Field of the Invention

The present invention relates to a high voltage semiconductor device, for example, an IGBT (Insulating Gate Bipolar Transistor).

2. Description of the Related Art

Technologies relating to IGBTs have been considerably developed. In the last ten years, decrease in ON-voltage and increase in switching speed have been advanced significantly. For example, IGBTs of the 600V series have been developed, in which the current fall time is 100 ns, the current density is 150 A/cm$^2$ and the ON voltage is 1.8V or lower. However, there is an increasing demand for a lower ON voltage and a higher switching speed. Further, as the switching speed is increased, decrease in noise is also required.

Use of a trench gate and a thin wafer is known as a technique for lowering the ON voltage.

FIG. 19 shows an example of the general IGBT of the 600V series. This IGBT has a non punch-through structure using no n$^+$ buffer layer. It comprises a p$^+$ drain layer 101, an about 100 μm thick n$^-$ high resistance layer 102, a p base layer 103, a source region 104 and a trench gate electrode 105. In this IGBT, since an anode injected with a small amount of impurities is formed of the thin drain layer 101, the switching speed can be increased without controlling the lifetime of the high resistance layer 102.

FIG. 20 shows another example of the IGBT. Like reference numerals denote the same parts as those shown in FIG. 19. The IGBT has a punch-through structure using an n$^+$ buffer layer 106. The n$^+$ buffer layer 106 and a high resistance layer 102 are formed on a p$^+$ substrate 107 by epitaxial growth. The punch-through IGBT is produced by using the p$^+$ substrate 107, which is relatively thick. Therefore, to lower the efficiency of implantation from a drain layer 101 to the high resistance layer 102, the n+buffer layer 106 of a high impurity concentration is used and the wafer is subjected to annealing by irradiation with an electron beam after completion of the wafer process. With the above structure, the lifetime can be reduced, thereby increasing the switching speed.

In the case of the punch-through IGBT, since the n$^+$ buffer layer 106 is used, the high resistance layer 102 can be thin. In the IGBT of the 600V series, the thickness of the high resistance layer 102 is about 50 μm for example. In the punch-through IGBT, the thickness of the p$^+$ substrate 107 is not particularly important but can be handled in the wafer process. To be specific, the substrate 107 is 500 to 600 μm thick.

As described above, the punch-through structure is suitable for lowering the ON voltage. However, the punch-through IGBT has the following problems.

(1) To increase the switching speed, the lifetime should be shortened or the efficiency of implantation to the p$^+$ drain layer 101 should be reduced. However, since the thick p$^+$ substrate is used in the punch-through IGBT, it is difficult to reduce the total amount of impurities in the drain layer 101 to lower the hole implantation efficiency. Therefore, the lifetime should inevitably be shortened. However, if the lifetime is shortened, the concentration of carriers in the high resistance layer 102 is lowered. In the case of the punch-through IGBT, since the high-resistance layer 102 is thin, the voltage drop of the high resistance layer 102 is increased, making it difficult to lower the ON voltage. Consequently, it is not easy to increase the switching speed in the punch-through IGBT.

(2) In the punch-through structure, a depletion layer is formed to extend in the high resistance layer 102 by a voltage applied when the current is turned off. The depletion layer is stopped by the n$^+$ buffer layer 106. For this reason, the drain current is immediately dropped to zero. Therefore, the drain voltage oscillates as shown in FIG. 21, resulting in generation of noise.

Under the circumstances, there is a demand for an IGBT which allows both increase in switching speed and decrease in noise.

BRIEF SUMMARY OF THE INVENTION

According to an aspect of the present invention, there is provided a semiconductor device comprising: a drain layer of a first conductivity type; a buffer layer of a second conductivity type formed above the drain layer; a high resistance layer of the second conductivity type formed on the buffer layer; a base layer of the first conductivity type formed on the high resistance layer; a source layer of the second conductivity type, containing a high concentration of impurities, formed in a surface region of the base layer; a gate electrode formed in the base layer with an insulating film interposed therebetween; and a low concentration layer formed between the drain layer and the buffer layer, an impurity concentration of the low concentration layer being lower than those of the drain layer and the buffer layer.

DETAILED DESCRIPTION OF THE INVENTION

Embodiments of the present invention will now be described with reference to the accompanying drawings.

(First Embodiment)

Figure 1:
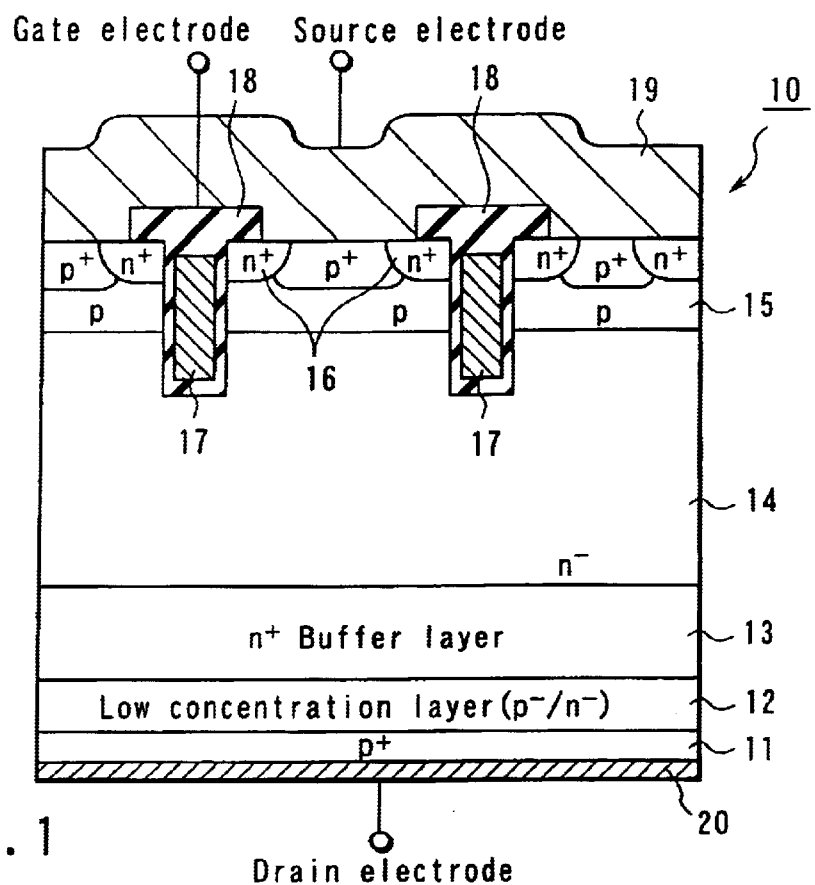
FIG. 1 is a cross-sectional view showing a structure of an IGBT according to a first embodiment of the present invention.

FIG. 1 is a cross-sectional view showing a structure of an IGBT according to a first embodiment of the present invention. The IGBT has the punch-through structure including an $n^+$ buffer layer 13. It is characterized in that a $p^-$ (or $n^-$) low concentration layer 12 is interposed between the buffer layer 13 and an $p^+$ drain layer 11.

More specifically, in the IGBT 10, for example, the $p^-$ low concentration layer 12 is formed on the $p^+$ drain layer 11. The $n^+$ buffer layer 13 is formed on the low concentration layer 12. An $n^-$ epitaxial layer 14 is formed on the buffer layer 13. A p type base layer 15 is formed on the epitaxial layer 14. An $n^+$ source region 16 is formed in a surface region of the base layer 15. A gate electrode 17 of the trench structure is formed in the source region 16, the base layer 15 and the epitaxial layer 14. The gate electrode 17 is insulated by a gate insulating film 18 from the source region 16, the base layer 15 and the epitaxial layer 14. A source electrode 19 made of, for example, aluminum, is formed on the overall surfaces of the base layer 15 and the source region 16. A drain electrode 20 is formed on the drain layer 11.

Figure 2:
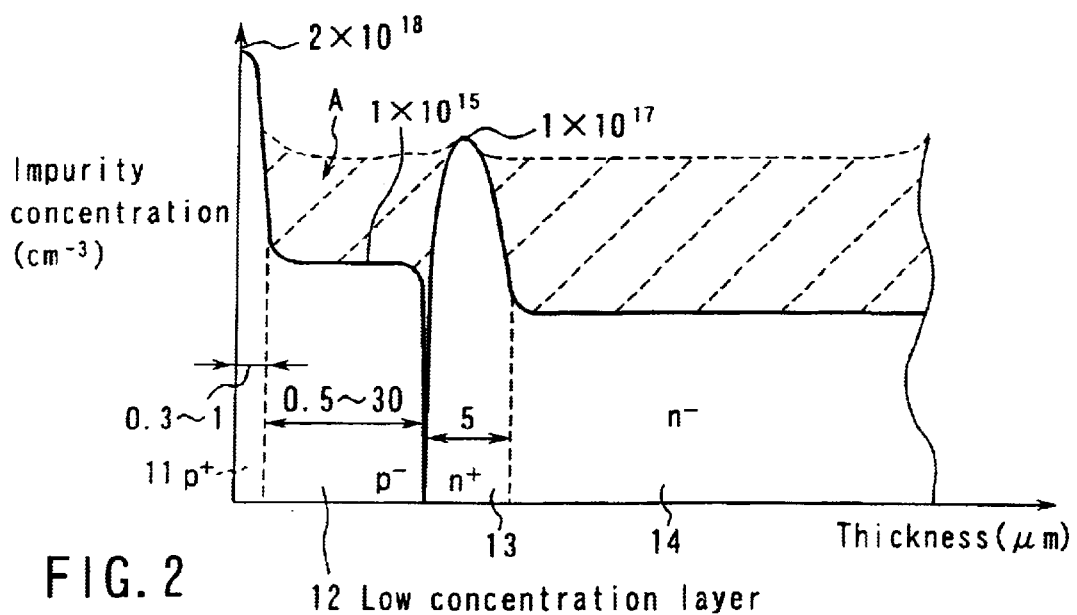
FIG. 2 is a diagram showing the relationship between the thickness and the impurity concentration of each of the layers of the IGBT shown in FIG. 1.

FIG. 2 shows the relationship between the thickness and the imparity concentration of each of the layers of the IGBT shown in FIG. 1. As shown in FIG. 2, the buffer layer 13 has a thickness of, for example, 5 $\mu$m and an impurity concentration of, for example, $1 \times 10^{17}$ cm$^{-3}$. The drain layer 11 has a thickness of, for example, 0.3 $\mu$m and an impurity concentration of, for example, $2 \times 10^{18}$ cm$^{-3}$. The low concentration layer 12 has a thickness of, for example, 0.5 $\mu$m to 30 $\mu$m and an impurity concentration of, for example, $1 \times 10^{16}$ cm$^{-3}$. The buffer layer 13 has the aforementioned thickness in a case where the impurity is arsenic. If phosphorus is introduced as the impurity, the thickness of the buffer layer 13 is, for example, 5 $\mu$m to 20 $\mu$m.

When the thickness of the low concentration layer 12 is measured, a portion that has a concentration of ½ or lower of the maximum concentration of, for example, the buffer layer 13 is measured. More specifically, since the maximum concentration of the buffer layer 13 is $1 \times 10^{17}$ cm$^{-3}$, the thickness of the portion of the $p^-$ layer 12 that has a concentration of $5 \times 10^{16}$ cm$^{-3}$ or lower is measured.

Figure 3:
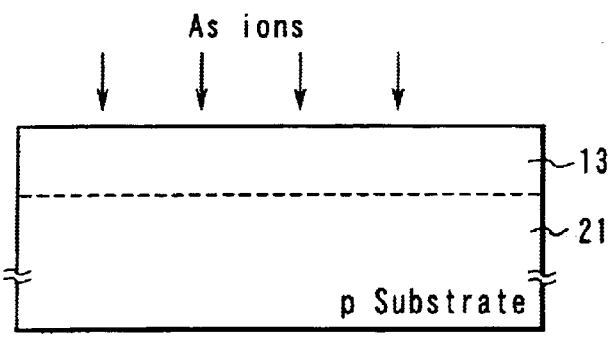
FIG. 3 is a cross-sectional view showing a step of manufacturing the IGBT shown in FIG. 1.
Figure 4:
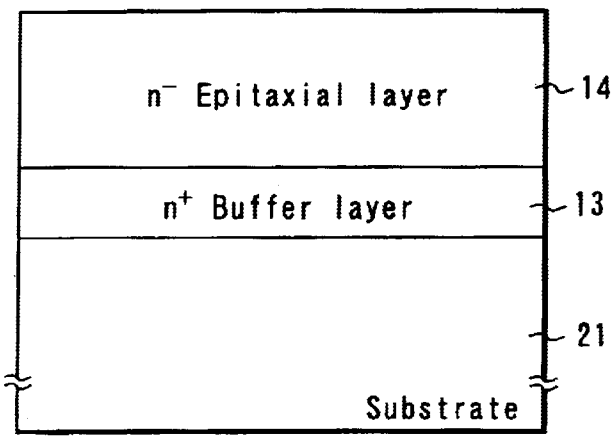
FIG. 4 is a cross-sectional view showing a step subsequent to the step shown in FIG. 3.
Figure 5:
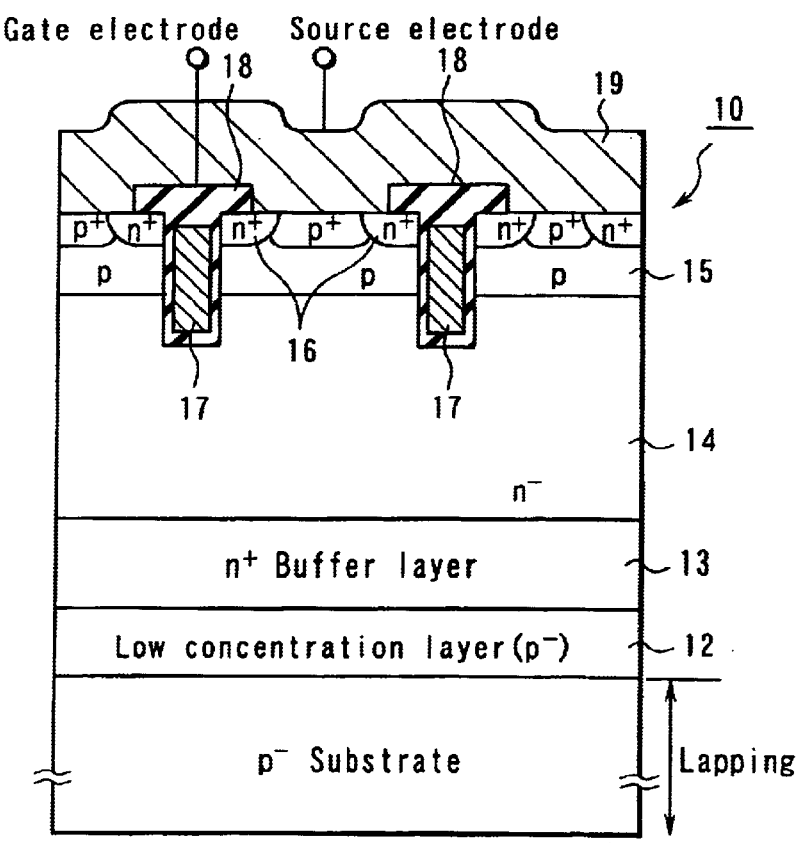
FIG. 5 is a cross-sectional view showing a step subsequent to the step shown in FIG. 4.

FIGS. 3 to 5 show a method for manufacturing the IGBT 10 described above. In the drawings, the same parts as those shown in FIG. 1 are identified by the same reference numerals as those used in FIG. 1.

As shown in FIG. 3, first, for example, arsenic (As) is ion-implanted to the surface of a high resistance wafer 21 of, for example, p type, thereby forming an $n^+$ buffer layer 13. As shown in FIG. 4, an $n^-$ high resistance epitaxial layer 14 is formed after he wafer 21 is annealed. The thickness of the epitaxial layer 14 is, for example 50 $\mu$m. Thereafter, a MOS gate structure is formed on the epitaxial layer 14, as shown in FIG. 5, using the process of manufacturing a conventional trench IBGT. Then, the rear surface of the wafer 21 is subjected to lapping to reduce the thickness of the wafer to, for example, about 5 $\mu$m. Thereafter, for example, boron is ion-implanted into the rear surface region of the wafer 21 and a heat treatment is performed, thereby forming a $p^+$ drain layer 11. As a result, as shown in FIG. 1, a low concentration 12 made of the wafer 21 is formed between the drain layer 11 and the buffer layer 13. Finally, a drain electrode 20 is formed on the drain layer 11. As a result, the IGBT 10 is completed.

In the above method, the $n^+$ buffer layer 13 is formed by ion-implanting an impurity into the wafer 21. However, it may be formed by epitaxial growth.

Figure 8:
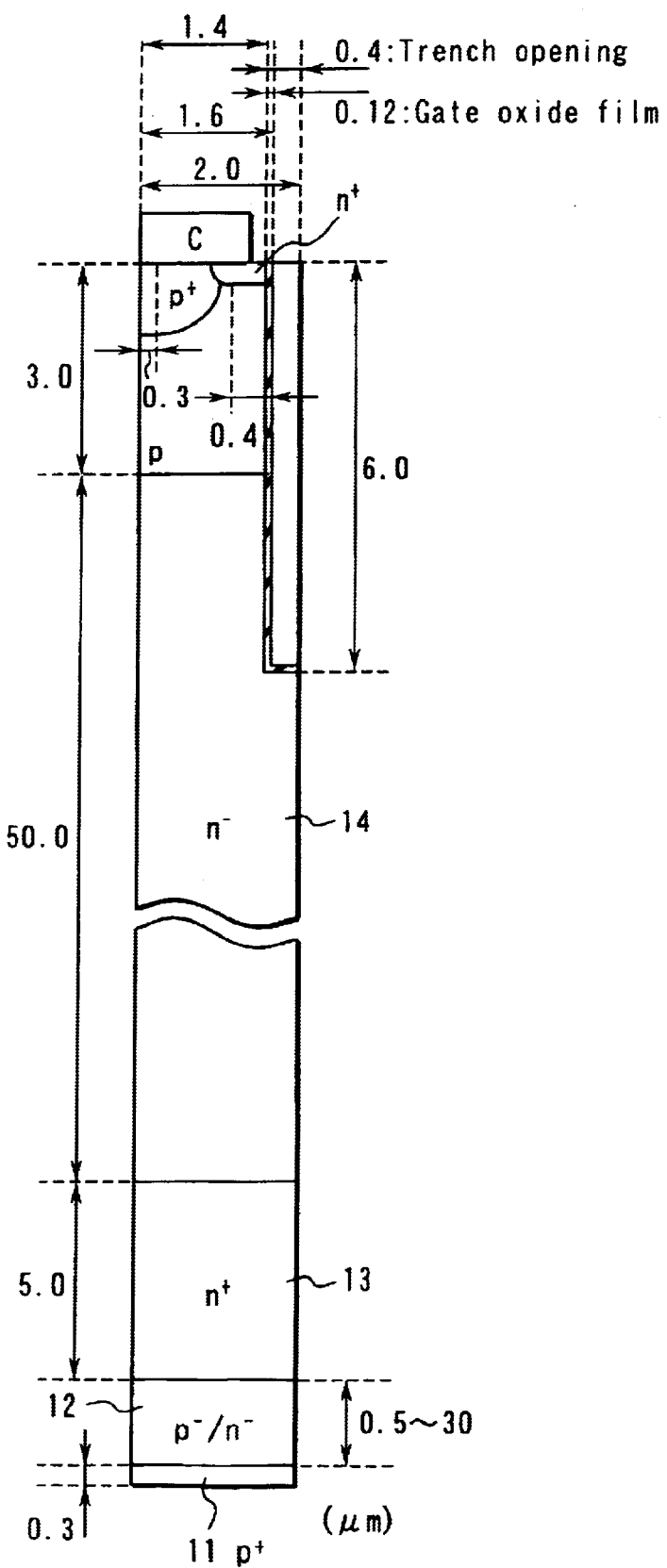
FIG. 8 is a cross-sectional view showing an IGBT of the 600V series manufactured by the method shown in FIGS. 3 to 5.

FIG. 8 shows a part of an IGST of the 600V series manufactured by the method described above. The IGBT is about 65 $\mu$m thick. To enhance the turn-off characteristic of the IGBT, it is preferable that the $n^+$ buffer layer 13 be as thin as possible, i.e., 15 $\mu$m or thinner, particularly, 5 $\mu$m or thinner. To increase the switching speed, it is preferable that the impurity concentration of the buffer layer 13 be as high as possible. However, the lower the impurity concentration, the lower the ON voltage.

Therefore, as a characteristic of the IGBT, if enhancement of the switching speed is required, the impurity concentration of the buffer layer 13 should be preferably, for example, $5 \times 10^{16}$ cm$^{-3}$ or higher, particularly preferably, $1 \times 10^{17}$ cm$^{-3}$ or higher.

If a low ON voltage is required as a characteristic of the IGBT, the impurity concentration of the buffer layer 13 should be, for example, $5 \times 10^{16}$ cm$^{-3}$ or lower.

In this embodiment, the low concentration layer 12 has the p type conductivity. However, it may have the n type conductivity. The thickness of the low concentration layer 12 is preferably 0.5 $\mu$m to 30 $\mu$m, particularly preferably, 1 $\mu$m to 20 $\mu$m. If the thickness is greater than 20 $\mu$m, the voltage of the element may be significantly dropped and the turn-off speed may be lowered.

The impurity concentration of the low concentration layer 12 need be lower than that of the buffer layer 13, preferably lower than ⅕ of the impurity concentration of the buffer layer 13. More specifically, it is preferable that the concentration of the layer 12 be $1 \times 10^{15}$ cm$^{-3}$.

The thickness of the low concentration layer 12 is influenced by an error that occurs during the process of lapping the substrate. Therefore, to reduce the product variation so that the implantation efficiency may not considerably change, it is desirable that the total amount of impurities in the low concentration layer 12 be less than 1/10 (10%) of that in the buffer layer 13.

As described above, the low concentration layer 12 may be of either p type or n type. Therefore, the lower limits of the impurity concentration and the total amount of impurities may be as low as substantially 0, so far as the production is possible.

Further, it is preferable that the impurity concentration of the drain layer 11 be $1\times10^{19}$ cm$^{-3}$ or less, particularly $5\times10^{18}$ cm$^{-3}$ or less, and the total amount of the impurity be $5\times10^{14}$ cm$^{-2}$ or less.

In the IGBT 10 described above, the p⁻ low concentration layer 12 is formed between the p⁺ drain layer 11 and the n⁺ buffer layer 13. Owing to the low concentration layer 12, when the IGBT is turned off, the drain current is cut off more slowly as compared to the case of the general IGBT, for the following reason. As indicated by the broken line in FIG. 2, carriers are accumulated in the low concentration layer 12 when the IGBT is on. The accumulated carriers flow to the drain layer 11 as a base current, when the IGBT is turned off. Therefore, the drain current reduces gradually, not rapidly.

Figure 6:
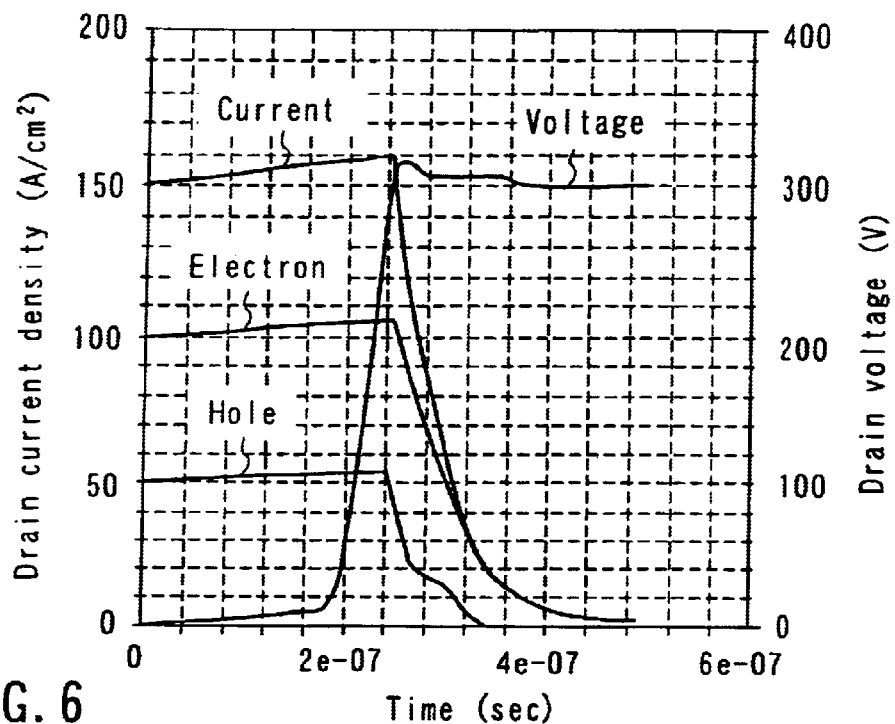
FIG. 6 is a diagram showing a turn-off characteristic of the IGBT shown in FIG. 1.

More specifically, as shown in FIG. 6, in the range where the drain current density is 25 (A/cm$^2$) or lower, the hole current does not rapidly reduce owing to the carriers flowing from the low concentration layer 12. Therefore, the drain current also decreases gradually. Thus, the drain voltage is prevented from oscillating, so that the noise may not generate at the turn-off time.

In addition, the amount of carriers in the low concentration layer 12 is less than that in the n⁻ epitaxial layer 14. Therefore, the turn-off loss can be reduced.

In the above IGBT 10, the thickness of the p+ drain layer 11 is reduced to reduce the dosage of the impurity into the drain 11. Therefore, the switching speed can be increased without shortening the lifetime of the n⁻ epitaxial layer 14. Consequently, the concentration of the carriers accumulated in the epitaxial layer 14 can be increased, so that the voltage drop can be 1.2V or less, which is about 0.5V lower than that in the general IGBT. Thus, the optimal characteristic of the IGBT can be obtained.

In the manufacture process of the above IGBT 10, first, the high resistance layer including the buffer layer 13 and the epitaxial layer 14, the base layer 15, the source region 17, the gate electrode 17 and the source electrode 19 is formed on the surface of the thick wafer. Thereafter, the rear surface region of the wafer is lapped or etched (hereinafter described as thinned). Then, the impurity ions are implanted through the rear surface of the wafer, so that the drain layer 11 and the low concentration layer 12 are formed. Therefore, the drain layer 11 and the low concentration layer 12 can be formed with high accuracy.

(Second Embodiment)

Figure 7:
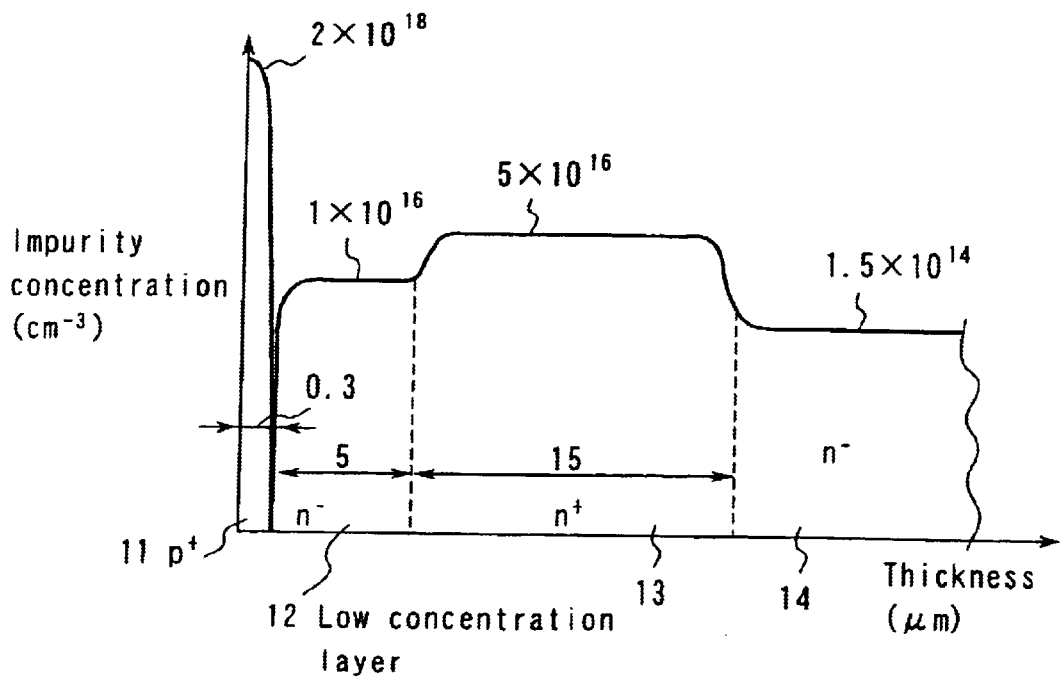
FIG. 7 is a diagram showing the relationship between the thickness and the impurity concentration of each of the layers of an IGBT according to a second embodiment of the present invention.

FIG. 7 shows the relationship between the thickness and the impurity concentration of each of the layers of an IGBT according to a second embodiment of the present invention. The second embodiment is different from the first embodiment in that the impurity concentration of the n⁺ buffer layer 13 is lower and an n⁻ low concentration layer 12 is formed between the buffer layer 13 and the p⁺ drain layer 11.

The buffer layer 13 has an imparity concentration of, for example, $5\times10^{16}$ cm$^{-3}$ and a thickness of, for example, 15 μm. The low concentration layer 12 has an impurity concentration of, for example, $1\times10^{15}$ cm$^{-3}$ and a thickness of, for example, 5 μm.

The thickness of the portion of the low concentration layer 12, that has a concentration of ½ of the maximum concentration of, for example, the buffer layer 13, is measured.

Thus, since the n⁻ low concentration layer 12 is formed between the buffer layer 13 and the drain layer 11, carriers are accumulated in the low concentration layer 12 when the IGBT is on. The accumulated carriers move to the drain layer 11, when the IGBT is turned off. At this time, holes are injected from the drain layer 11, and the drain current is slowly reduced to zero. Therefore, like the first embodiment, the drain voltage is prevented from oscillating, so that the noise may not generate at the turn-off time.

In addition, since a large quantity of carriers are accumulated in the low concentration layer 12, the voltage in the low concentration layer 12 drops little. Accordingly, the ON voltage of the element hardly rises.

(Third Embodiment)

A third embodiment of the present invention will now be described.

In the method for manufacturing the above IGBT, it is necessary to maintain the dosage from the drain layer 11 (which serves as a p emitter), so that the characteristic can be stabilized. However, in the above method, after the wafer is thinned, the drain layer 11 is activated by impurity ion implantation. The implanted imparity greatly varies in activation rate depending on the temperature or time of the annealing. Therefore, it is difficult to regulate the total amount of the impurity in the drain layer of the completed element; that is, the characteristic of the drain layer 11 may vary. It is not appropriate to fully perform the heat treatment, for example, at a high temperature or for a long period, in order to fully activate the drain layer, since the profile on the element surface may change in this case. To avoid this, according to the third embodiment, the drain layer 11 is formed before the buffer layer 13, thereby decreasing the dosage of impurity ions that are implanted into the wafer after the rear surface region of the wafer is thinned.

Figure 9:
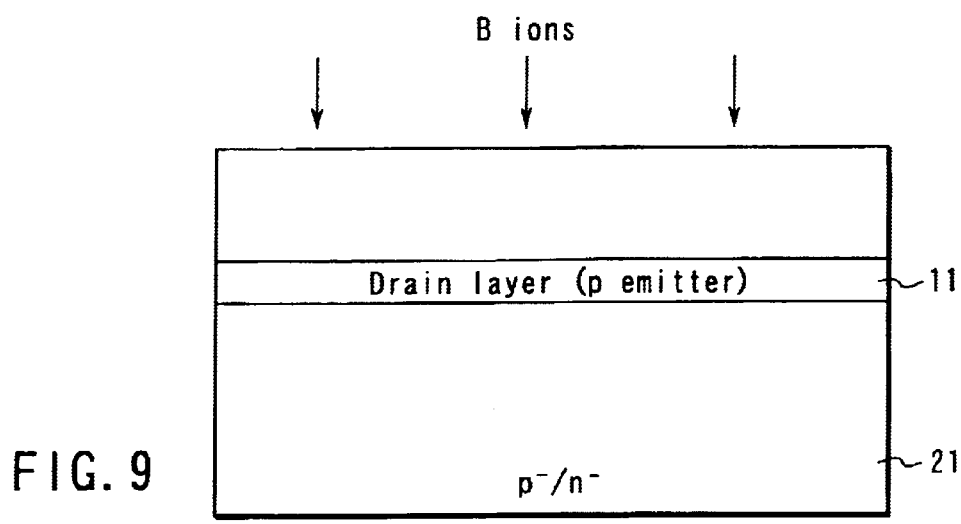
FIG. 9 is a cross-sectional view showing a step of manufacturing an IGBT according to a third embodiment of the present invention.

More specifically, as shown in FIG. 9, first a p-type impurity such as boron is ion-implanted into the wafer 21 to form the drain layer 11.

Figure 10:
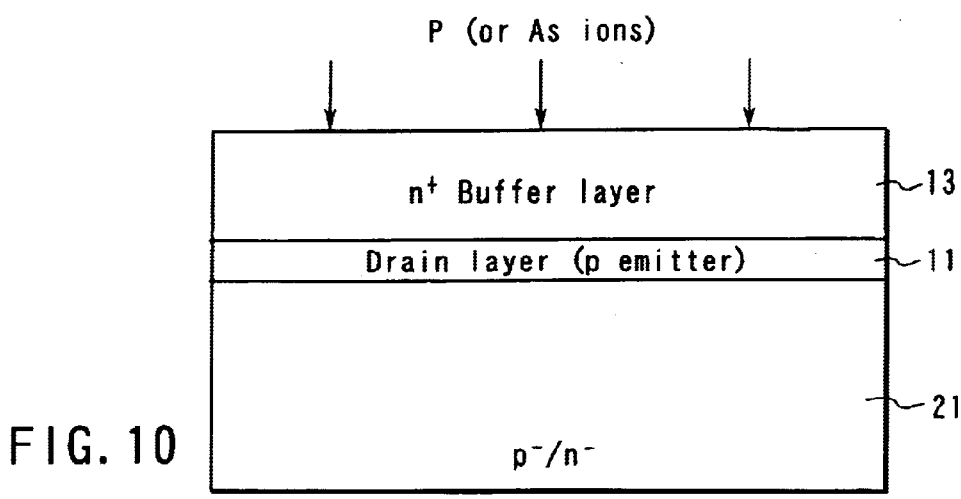
FIG. 10 is a cross-sectional view showing a step subsequent to the step shown in FIG. 9.

Thereafter, as shown in FIG. 10, an n-type impurity such as phosphorus or arsenic is ion-implanted into the wafer 21 to form the buffer layer 13. The implanted p-type and n-type impurities are annealed and fully activated. At this stage, no other ion is implanted and no metal or the like is deposited. Therefore, the heat treatment can be fully performed, with the result that substantially 100% of the impurities can be activated. In this manner, the n⁺ buffer 13 is formed on the drain layer 11. Thereafter, an epitaxial layer, a base layer, a source layer, a gate layer, etc., which are not shown, are formed in the same manner as in the above embodiments.

Figure 11:
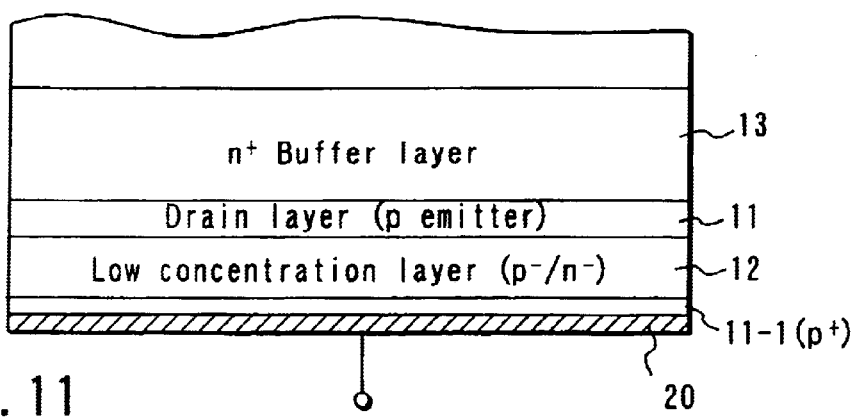
FIG. 11 is a cross-sectional view showing a step subsequent to the step shown in FIG. 10.

Subsequently, as shown in FIG. 11, the rear surface region of the wafer 21 is thinned to a required thickness. Then, a p-type impurity such as boron is ion-implanted in a small amount into the rear surface region of the wafer, thereby forming a contact layer 11-1. The function of the contact layer 11-1 is only to make ohmic contact with an electrode. Therefore, the surface concentration of the contact layer 11-1 may be as low as that enough to make ohmic contact, and a small amount of impurity suffices. A low concentration layer 12 is formed between the contact layer 11-1 and the drain layer 11. Thus, since the total amount of the impurities in the low concentration layer 12 and the contact layer 11-1 is negligible, the sum of the amounts of impurities in the drain layer 11, the low concentration layer 12 and the contact layer 11-1 is determined by the amount of the total amount of the impurity in the drain layer 11.

Figure 12:
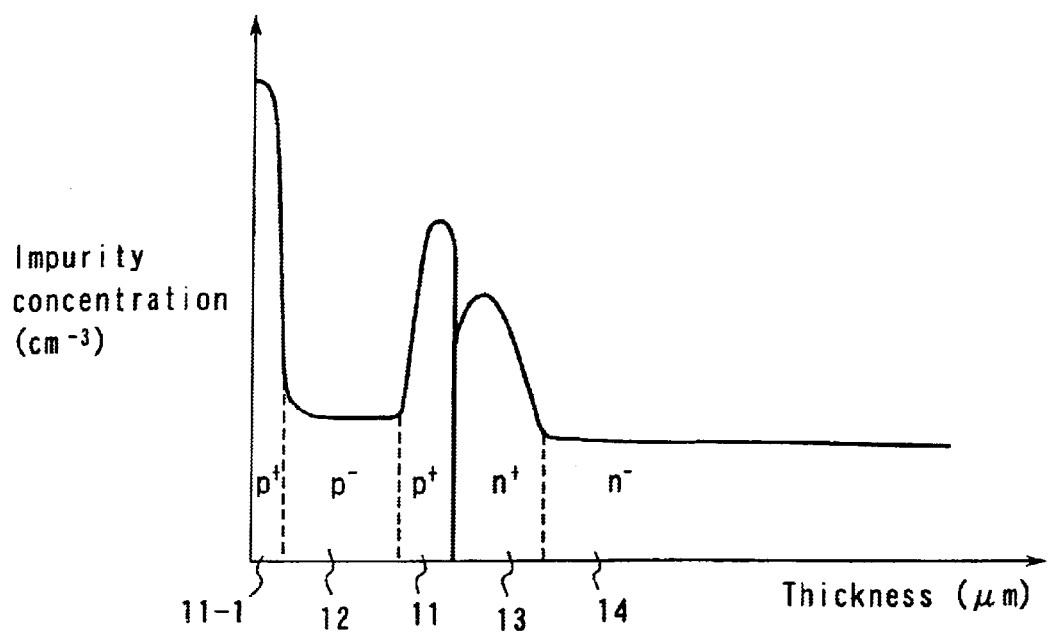
FIG. 12 is a diagram showing an example of the relationship between the thickness and the impurity concentration of each of the layers of the IGBT shown in FIG. 11.
Figure 13:
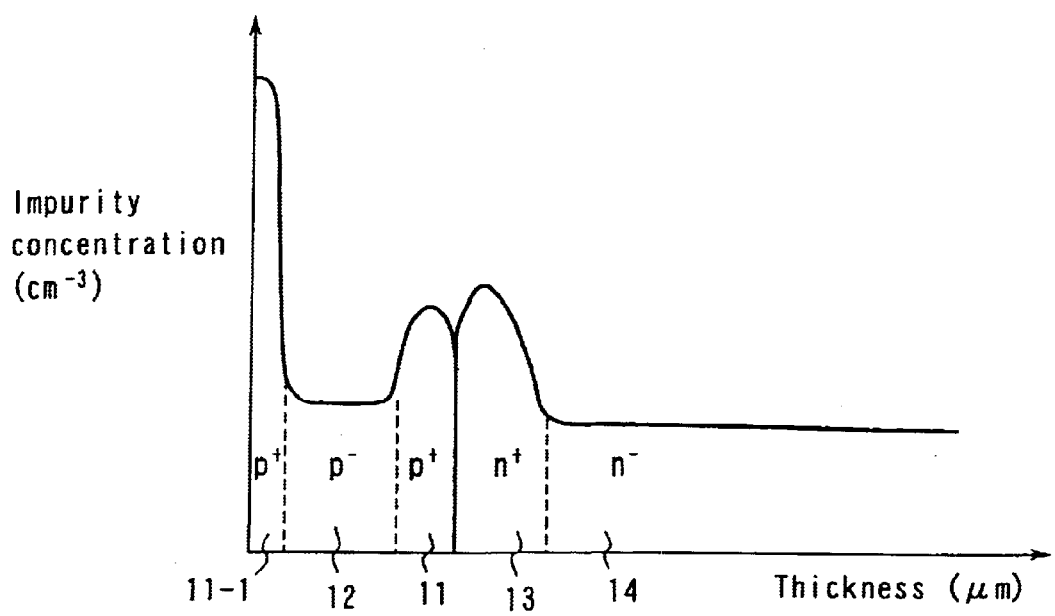
FIG. 13 is a diagram showing another example of the relationship between the thickness and the impurity concentration of each of the layers of the IGBT shown in FIG. 11.

FIGS. 12 and 13 are impurity profiles of the IGBT shown in FIG. 11. FIG. 13 is different from FIG. 12 in concentration and thickness of the drain layer 11. More specifically, the concentration of the drain layer 11 in FIG. 13 is lower than that of the drain layer 11 in FIG. 12. In addition, the drain layer 11 in FIG. 13 is thicker than the drain layer 11 in FIG. 12. However, in both FIGS. 12 and 13, the sum of the amounts of impurities in the drain layer 11 and the contact layer 11-1 is substantially the same as the total amount of the impurity in the drain layer 11 of the first embodiment, preferably, $5\times10^{14}$ cm$^{-2}$ or less.

In the structure shown in FIG. 11, the low concentration layer 12 is not interposed between the drain layer 11 and the buffer layer 13 unlike in the first and second embodiments. However, the whole of the drain layer 11, the low concentration layer 12 and the contact layer 11-1 serve as a drain layer. In other words, the drain layer as a whole has high concentration layers, whose the impurity concentration is high, on the sides near the buffer layer 13 and the drain electrode 20. It has a low concentration region, whose the impurity concentration is low, between the high concentration layers.

The operation of the IGBT shown in FIG. 11 is the same as those of the first and second embodiments. Namely, carriers are accumulated in the low concentration layer 12 when the IGBT is on. The accumulated carriers flow to the drain layer 11 as a base current, when the IGBT is turned off. Therefore, the drain current reduces gradually, not rapidly.

According to the third embodiment, the drain layer 11 is formed before the wafer is thinned, thereby reducing the amount of impurity injected into the wafer after the wafer is thinned. Therefore, a drain layer with a stable characteristic is formed. Moreover, since the drain layer 11 is formed before the wafer is thinned, the third embodiment is advantageous in that the manufacturing process is easier.

(Fourth Embodiment)

A fourth embodiment of the present invention will now be described.

If the low concentration layer 12 is thick due to an error when the wafer is thinned, a large amount of carriers is accumulated in the low concentration layer 12 when the IGBT is on. Therefore, it takes much time to discharge the accumulated carriers when the IGBT is turned off, resulting that the turnoff delays.

To avoid this, according to the fourth embodiment, a short lifetime region whose lifetime is short is formed inside the low concentration layer 12 or between the low concentration layer 12 and the buffer layer 13. The turn-off time is decreased by the short lifetime region 31.

Figure 15:
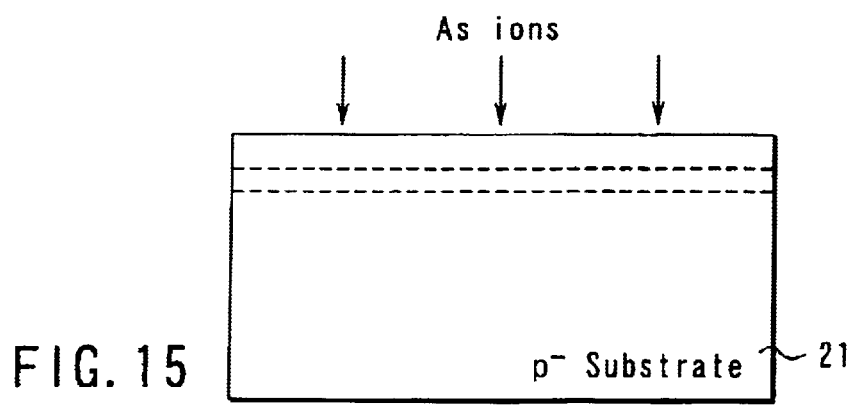
FIG. 15 is a cross-sectional view showing a step of manufacturing the IGBT shown in FIG. 14.
Figure 16:
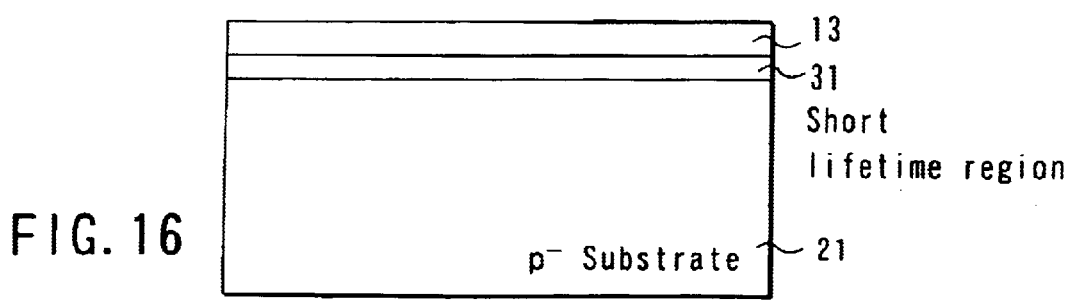
FIG. 16 is a cross-sectional view showing a step subsequent to the step shown in FIG. 15.

FIGS. 15 and 16 show an example of a method for forming the short lifetime region 31. In general, in the case where a heavy element such as arsenic is ion-implanted to a high concentration of about $1\times10^{14}$ cm$^{-2}$, a continuous amorphous layer is formed. Therefore, crystallinity can be recovered by low-temperature annealing through solid-phase epitaxial growth from the substrate crystal. In addition, almost 100% carriers are activated.

On the other hand, in the case of low or medium-concentration ion implantation, a number of crystal defects occur, while no amorphous layer is formed. Therefore, a secondary defect is liable to occur during crystallinity recovery by annealing. To completely anneal the substrate, a high temperature of 900 to 1000° C. is required. Based on this characteristic of arsenic or the like, according to the fourth embodiment, a short lifetime region is formed using both medium and low-concentration ion implantation.

As shown in FIG. 15, first, arsenic ions of the dosage of about $1\times10^{13}$ cm$^{-2}$ are implanted into the surface region of, for example, a p-type high resistance wafer 21 under high acceleration. Further, arsenic ions of the dosage of about $1\times10^{14}$ cm$^{-2}$ are implanted under low acceleration. Thereafter, the wafer 21 is annealed at a low temperature of, for example, 900° C., so that, for example, 50% of the implanted impurities are activated.

As a result, as showing FIG. 16, the crystallinity of the surface region of the wafer 21 in which the high-concentration ions are implanted is recovered, thereby forming an n$^+$ buffer layer 13. On the other hand, the crystallinity of a portion slightly deeper than the buffer layer 13, in which the medium-concentration ions are implanted, is not fully recovered, The deeper portion is studded with many crystal defects and serves as the short lifetime region 31.

The total mount of impurities implanted into the wafer in order to form the buffer layer 13 and the short lifetime region 31 is about $6\times10^{13}$ cm$^{-2}$. As described before, if enhancement of the switching speed is required, the impurity concentration of the buffer layer 13 after annealing should be preferably, for example, $5\times10^{16}$ cm$^{-3}$ or higher, particularly preferably, $1\times10^{17}$ cm$^{-3}$ or higher.

If a low ON voltage is required as a characteristic of the IGBT, the impurity concentration of the buffer layer 13 should be, for example, $5\times10^{16}$ cm$^{-3}$ or lower.

Figure 14:
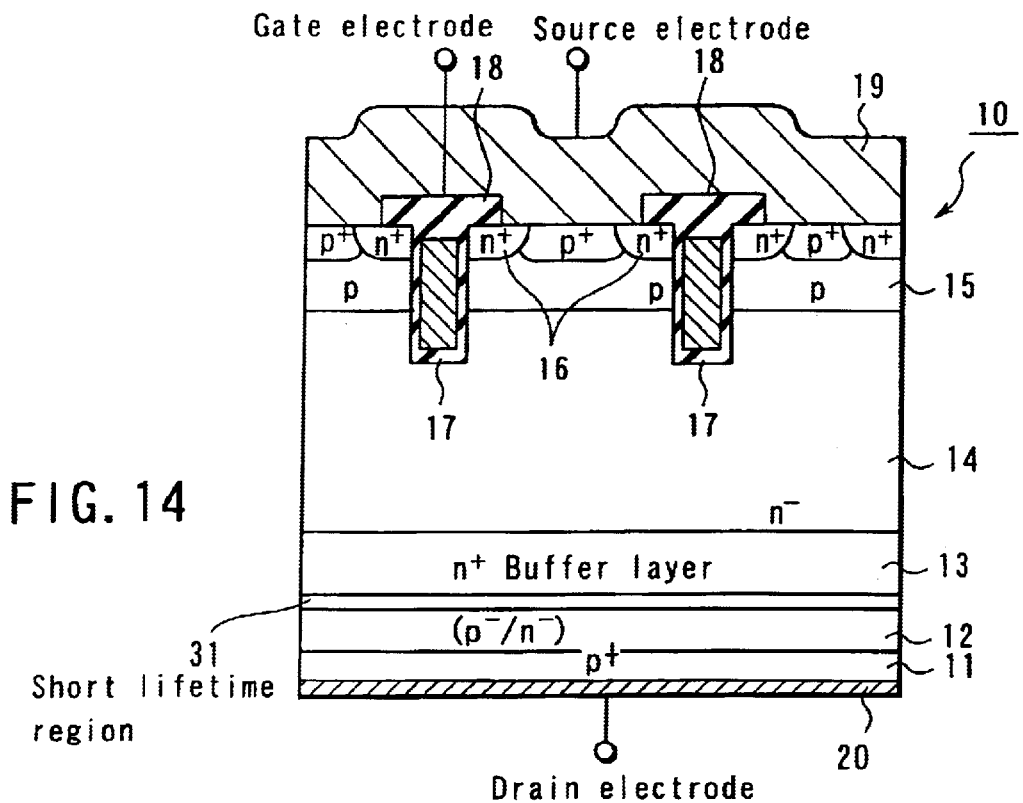
FIG. 14 is a cross-sectional view showing an IGBT according to a fourth embodiment of the present invention.

Subsequently, in the same manner as in the case of the first embodiment, an epitaxial layer 14 as a high resistance layer, a base layer, a source region, etc. are formed on the buffer layer 13. Then, the rear surface region of the wafer 21 is thinned. Thereafter, a drain layer 11, etc. are formed, with the result that the IGBT shown in FIG. 14 is completed.

According to the fourth embodiment, the short lifetime region 31 is formed between the low concentration layer 12 and the buffer layer 13. Therefore, the amount of carriers discharged from the low concentration layer 12 can be reduced. Accordingly, the turn-off loss can be further reduced. Consequently, even if the low concentration layer 12 is thick due to an error when the wafer is thinned, the tail of the drain current can be reduced, while oscillation of the drain current during the turn-off time can be prevented.

In the fourth embodiment, the short lifetime region 31 is formed between the low concentration layer 12 and the buffer layer 13. However, the present invention is not limited to this structure.

Figure 17:
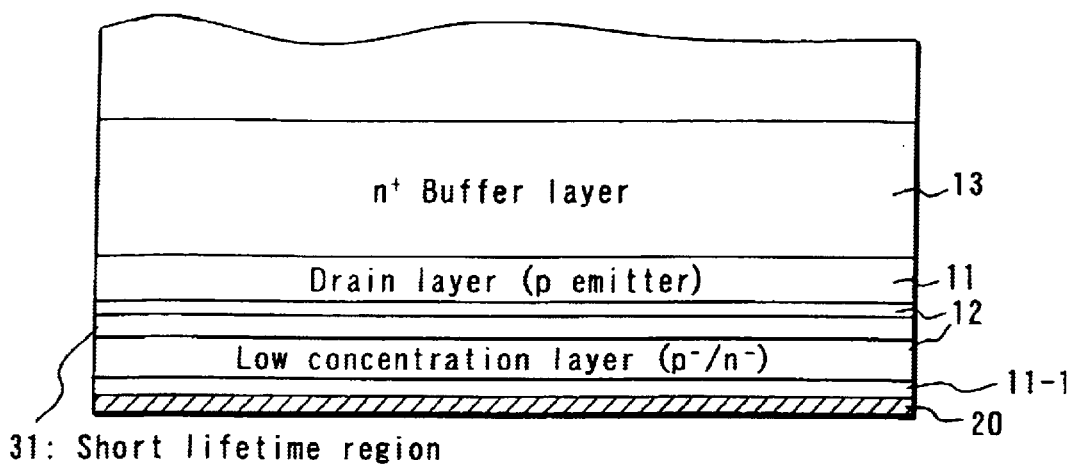
FIG. 17 is a cross-sectional view showing a modification of the fourth embodiment.

FIG. 17 shows a modification of the fourth embodiment to which the third embodiment is applied. In the modification, a short lifetime region 31 is formed in the low concentration region 12. With this structure also, the same effect as that of the fourth embodiment can be obtained.

In the fourth embodiment, the short lifetime region 31 is formed through ion implantation and low-temperature annealing. The present invention is not limited to this method. The short lifetime region may be formed by irradiating the wafer with, for example, protons, after the IGBT of the first or third embodiment is formed.

Figure 18:
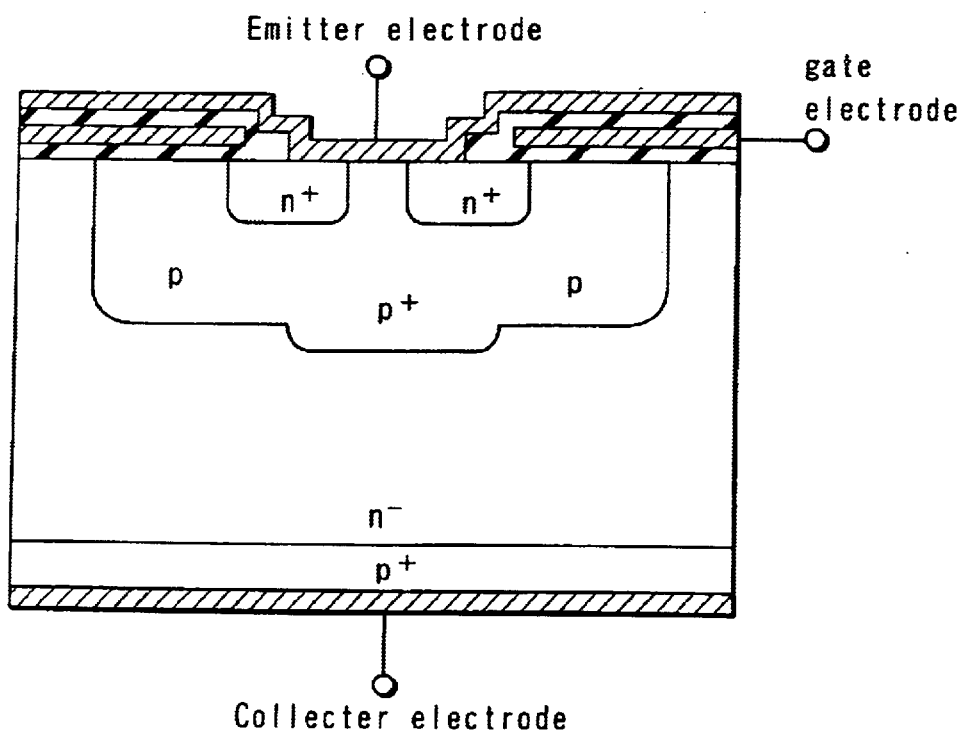
FIG. 18 is a cross-sectional view showing a structure of an IGBT of the conventional planar gate type.
Figure 19:
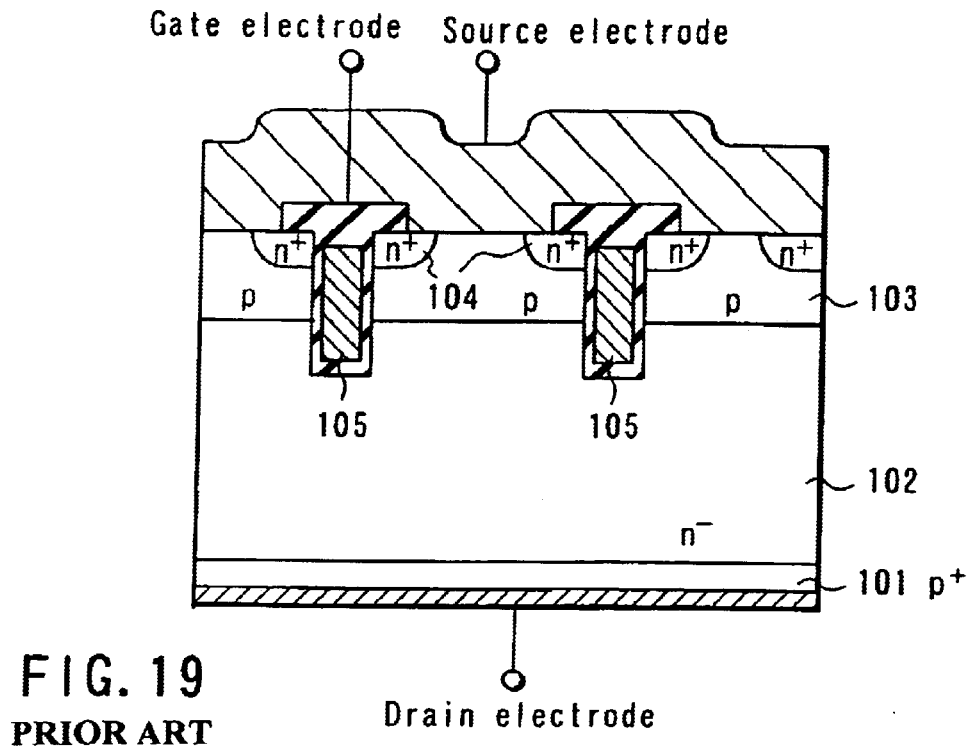
FIG. 19 is a cross-sectional view showing a structure of an IGBT of the conventional trench gate type.
Figure 20:
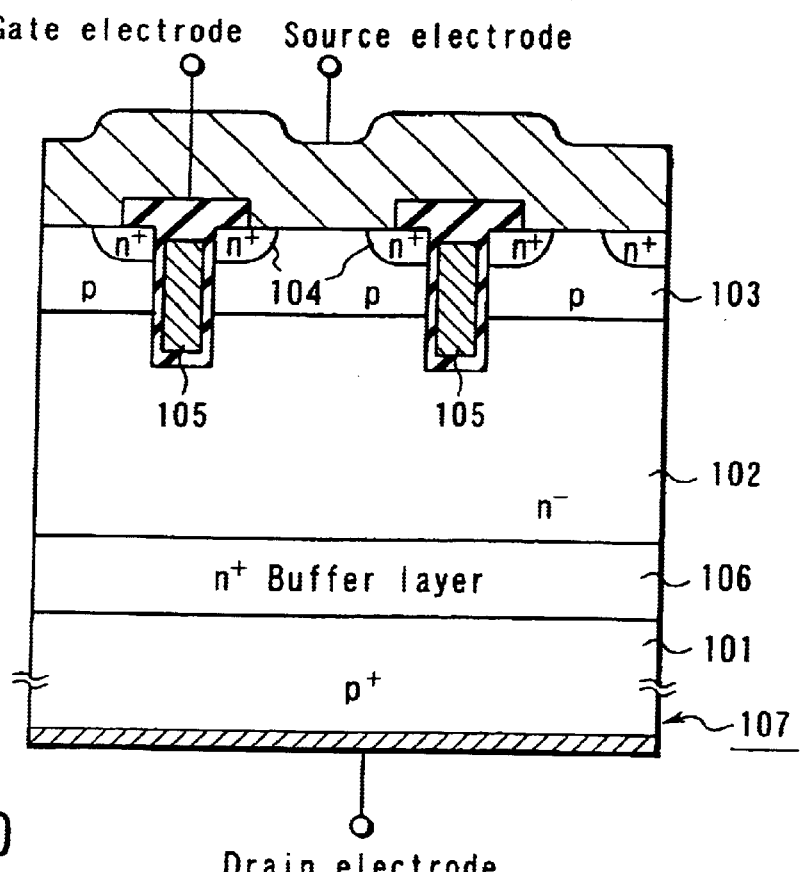
FIG. 20 is a cross-sectional view showing another example of the conventional IGBT.
Figure 21:
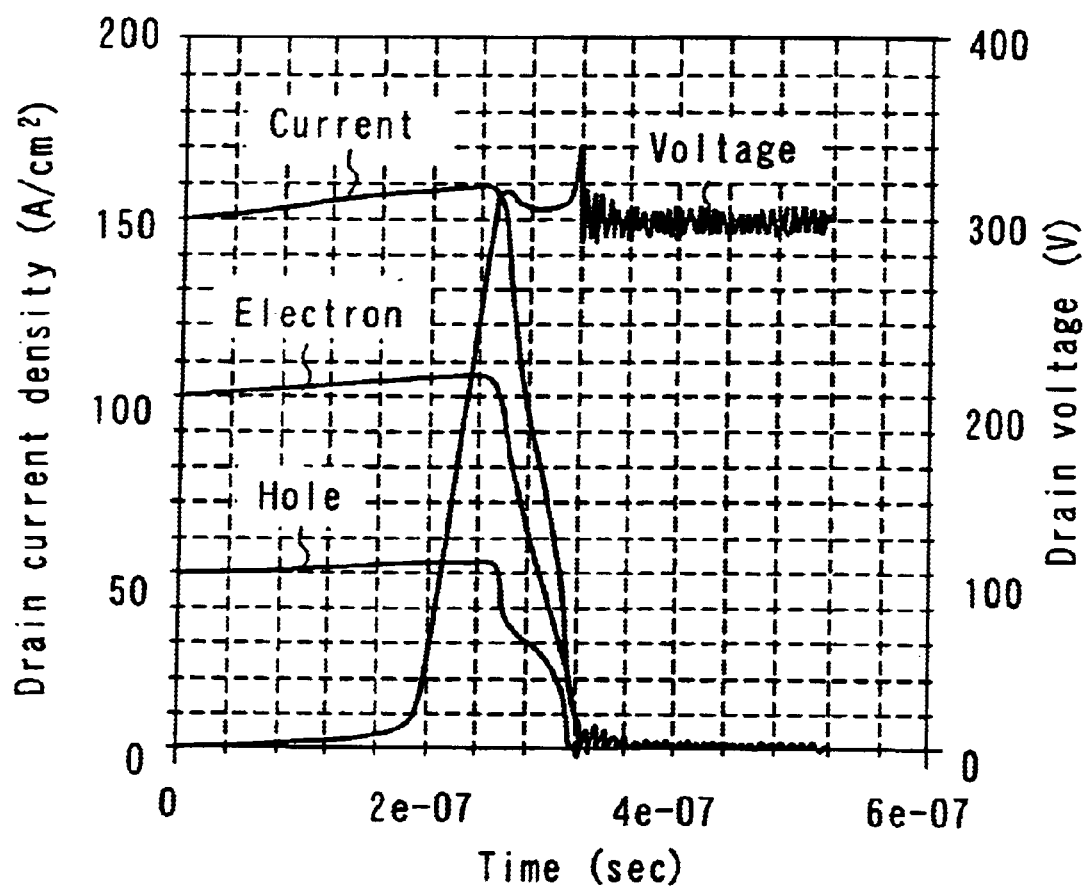
FIG. 21 is a diagram sowing a turn-off characteristic of the conventional IGBT.

The above descriptions of the first to fourth embodiments refer to an IGBT of the trench gate type as an example. However, the present invention is not limited to this type. The present invention can be applied to an IGST of the planar gate type, for example, as shown in FIG. 18.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a drain layer of a first conductivity type;
   a buffer layer of a second conductivity type formed above the drain layer;
   a high resistance layer of the second conductivity type formed on the buffer layer;
   a base layer of the first conductivity type formed on the high resistance layer;
   a source layer of the second conductivity type, containing a high concentration of impurities, formed in a surface region of the base layer;
   a gate electrode formed in the base layer with an insulating film interposed therebetween; and
   a low concentration layer formed between the drain layer and the buffer layer, an impurity concentration of the low concentration layer being lower than those of the drain layer and the buffer layer,
   wherein the drain layer is an impurity diffusion layer, and a total amount of impurities contained in the drain layer is at most $5 \times 10^{14}$ cm$^{-2}$.

2. The device according to claim 1, wherein the low concentration layer is of first or second conductivity type.

3. The device according to claim 2, wherein a portion of the low concentration layer, which has a concentration at most ½ of a maximum concentration of the buffer layer, is at least 0.5 μm and at most 30 μm thick.

4. The device according to claim 2, wherein a portion of the low concentration layer, which has a concentration at most ½ of a maximum concentration of the buffer layer, is at least 1 μm and at most 20 μm thick.

5. The device according to claim 2, wherein the impurity concentration of the low concentration layer is lower than ⅕ of that of the buffer layer.

6. The device according to claim 2, wherein the impurity concentration of the low concentration layer is at most $1 \times 10^{16}$ cm$^{-3}$.

7. The device according to claim 2, wherein a total amount or impurities contained in the low concentration layer is less than ⅒ of that of the buffer layer.

8. The device according to claim 1, further comprising a region, whose lifetime is short, provided between the low concentration layer and the buffer layer.

9. The device according to claim 1, wherein the gate electrode is a trench gate.

10. The device according to claim 1, wherein the gate electrode is a planar gate.

11. A semiconductor device comprising:
    a drain layer of a first conductivity type;
    a buffer layer of a second conductivity type formed above the drain layer;
    a high resistance layer of the second conductivity type formed on the buffer layer;
    a base layer of the first conductivity type formed on the high resistance layer;
    a source layer of the second conductivity type, containing a high concentration of impurities, formed in a surface region of the base layer;
    a gate electrode formed in the base layer with an insulating film interposed therebetween; and
    a drain electrode to supply a potential to the drain layer,
    a low concentration layer formed between the drain layer and the buffer layer, the low concentration layer having an impurity concentration lower than the impurity concentrations of the drain layer and the buffer layer,
    wherein a thickness of the drain layer is 1 μm or less, and a total amount of impurities contained in the drain layer is at most $5 \times 10^{14}$ cm$^{-2}$.

12. The device according to claim 11, wherein the low concentration layer is of first or second conductivity type.

13. The device according to claim 12, wherein a portion of the low concentration layer, which has a concentration at most ½ of a maximum concentration of the buffer layer, is at least 0.5 μm and at most 30 μm thick.

14. The device according to claim 12, wherein a portion of the low concentration layer, which has a concentration at most ½ of a maximum concentration of the buffer layer, is at least 1 μm and at most 20 μm thick.

15. The device according to claim 12, wherein the impurity concentration of the low concentration layer is lower than ⅕ of that of the buffer layer.

16. The device according to claim 12, wherein the impurity concentration of the low concentration layer is at most $1 \times 10^{16}$ cm$^{-3}$.

17. The device according to claim 12, wherein a total amount of impurities contained in the low concentration layer is less than ⅒ of that of the buffer layer.

18. The device according to claim 11, further comprising a region, whose lifetime is short, provided inside the low concentration layer.

19. The device according to claim 11, wherein the gate electrode is a trench gate.

20. The device according to claim 11, wherein the gate electrode is a planar gate.

21. The device according to claim 11, wherein a thickness of the drain layer is 0.3 to 1 μm.

22. A semiconductor device comprising:
    a drain layer of a first conductivity type;
    a buffer layer of a second conductivity type formed above the drain layer;
    a high resistance layer of the second conductivity type formed on the buffer layer;
    a base layer of the first conductivity type formed on the high resistance layer;
    a source layer of the second conductivity type, containing a high concentration of impurities, formed in a surface region of the base layer;
    a gate electrode formed in the base layer with an insulating film interposed therebetween; and
    a low concentration layer formed between the drain layer and the buffer layer, said low concentration layer having an impurity concentration lower than impurity concentrations of the drain layer and the buffer layer,
    wherein a thickness of the drain layer is 0.3 to 1 μm.

23. The device according to claim 22, wherein the low concentration layer is of first or second conductivity type.

24. The device according to claim 23, wherein the low concentration layer has a portion having a concentration at most ½ of a maximum concentration of the buffer layer and a thickness of at least 0.5 μm and at most 30 μm.

25. The device according to claim 23, wherein the low concentration layer has a portion having a concentration at most ½ of a maximum concentration of the buffer layer and a thickness of at least 1 μm and at most 20 μm.

26. The device according to claim 23, wherein the impurity concentration of the low concentration layer is lower than ⅕ of that of the buffer layer.

27. The device according to claim 23, wherein the impurity concentration of the low concentration layer is at most $1 \times 10^{16}$ cm$^{-3}$.

28. The device according to claim 23, wherein a total amount of impurities contained in the low concentration layer is less than ⅒ of that of the buffer layer.

29. The device according to claim 22, further comprising a region, whose lifetime is short, provided between the low concentration layer and the buffer layer.

30. The device according to claim 22, further comprising a region, whose lifetime is short, provided inside the low concentration layer.

31. The device according to claim 22, wherein the gate electrode is a trench gate.

32. The device according to claim 22, where in the gate electrode is a planar gate.

* * * * *

UNITED STATES PATENT AND TRADEMARK OFFICE
CERTIFICATE OF CORRECTION

PATENT NO. : 6,617,641 B2
APPLICATION NO. : 10/059186
DATED : September 9, 2003
INVENTOR(S) : Akio Nakagawa et al.

Page 1 of 1

It is certified that error appears in the above-identified patent and that said Letters Patent is hereby corrected as shown below:

In the Specification

Column 4, line 34, change "IGST" to --IGBT--.

Column 8, line 58, change "IGST" to --IGBT--.

In the Claims

Column 9, line 14, Claim 1, change "in the base layer" to --at the base layer--.

Column 9, line 61, Claim 11, change "in the base layer" to --at the base layer--.

Column 10, line 42, Claim 22, change "in the base layer" to --at the base layer--.

Signed and Sealed this
Twenty-fourth Day of December, 2013

Margaret A. Focarino
*Commissioner for Patents of the United States Patent and Trademark Office*